United States Patent
Hunt et al.

(10) Patent No.: US 10,276,773 B2
(45) Date of Patent: Apr. 30, 2019

(54) WEARABLE DEVICE, SYSTEM AND METHOD FOR CONTROL OF THE WEARABLE DEVICE

(71) Applicant: Sony Corporation, Tokyo (JP)

(72) Inventors: Alexander Hunt, Tygelsjö (SE); Samir Drincic, Lund (SE)

(73) Assignees: SONY CORPORATION, Tokyo (JP); SONY MOBILE COMMUNICATIONS INC., Tokyo (JP)

( * ) Notice: Subject to any disclaimer, the term of this patent is extended or adjusted under 35 U.S.C. 154(b) by 167 days.

(21) Appl. No.: 14/595,348

(22) Filed: Jan. 13, 2015

(65) Prior Publication Data

US 2016/0204332 A1   Jul. 14, 2016

(51) Int. Cl.
| | |
|---|---|
| *H01L 41/04* | (2006.01) |
| *H04M 1/05* | (2006.01) |
| *A44C 5/00* | (2006.01) |
| *H04M 1/725* | (2006.01) |

(52) U.S. Cl.
CPC ............ *H01L 41/042* (2013.01); *H04M 1/05* (2013.01); *A44C 5/0007* (2013.01); *A44C 5/0053* (2013.01); *H04M 1/7253* (2013.01)

(58) Field of Classification Search
CPC ..... H01L 41/00; H01L 41/04; H01L 29/1054; A44C 5/00; H04M 1/05
See application file for complete search history.

(56) References Cited

U.S. PATENT DOCUMENTS

| | | | | |
|---|---|---|---|---|
| 2013/0262298 | A1 | 10/2013 | Morley | 705/39 |
| 2013/0293494 | A1 | 11/2013 | Reshef | 345/173 |
| 2013/0293498 | A1* | 11/2013 | Kim | G06F 3/0412 |
| | | | | 345/173 |
| 2015/0207914 | A1* | 7/2015 | Hunt | H04M 19/047 |
| | | | | 340/407.1 |
| 2015/0288796 | A1* | 10/2015 | Choi | G06F 3/017 |
| | | | | 455/557 |
| 2016/0120734 | A1* | 5/2016 | Ishikawa | A42B 1/242 |
| | | | | 601/151 |

FOREIGN PATENT DOCUMENTS

| | | | |
|---|---|---|---|
| GB | 2 439 362 A | 12/2007 | |
| WO | 2014/117125 A1 | 7/2014 | |
| WO | WO 2014117125 A1 * | 7/2014 | ............. G06F 3/011 |

* cited by examiner

*Primary Examiner* — Eduardo Colon Santana
*Assistant Examiner* — Said Bouziane
(74) *Attorney, Agent, or Firm* — Renner Otto Boisselle and Sklar (57) ABSTRACT

The invention concerns an electronic wearable device (1) adapted to form a loop around a body part of a user and comprising an elongated member (10) being a part of the loop and a control unit (20). The elongated member (10) comprises an electroactive polymer (11), whereby the shape of the electroactive polymer is adapted to be changed by regulating a voltage applied to the electroactive polymer. The invention also concerns an electronic wireless communication system comprising the electronic wearable device and a mobile electronic communication device for wireless communication with the electronic wearable device.

20 Claims, 8 Drawing Sheets

WEARABLE DEVICE, SYSTEM AND METHOD FOR CONTROL OF THE WEARABLE DEVICE

TECHNICAL FIELD

The present invention relates to an electronic wearable device, a system for wireless communication between the electronic wearable device and at least one mobile electronic communication device, and a method for controlling fitting of the electronic wearable device.

BACKGROUND ART

Users of mobile electronic devices are today and in the near future more and more using portable electronic wearable devices, e.g. watches, wristlets/-bands, ankle bands, armbands, components integrated into clothes, necklaces etc, for training, e.g. running, and monitoring their physical activity, e.g. how many steps the user has "consumed" walking during the day, and their biological status, such as their heart beats delivering information to the user. Some examples of such wearables are Nike+ Fuelband, UP24 by Jawbone Wristband, and MIO Alpha Bluetooth Heart Rate Monitor. The wearable devices gradually perform more and more inter-action with the user, and also allow the user to interact with other mobile electronic communication devices connectable to the wearable device.

To enable for example the Nike+ Fuelband to fit, in size, to different users, the Nike+ Fuelband comes with three distinct standard sizes, small, medium/large and extra-large, and is delivered with two loose insert links to make it larger, if needed. The UP24 Jawbone Wristband also comes in three standard sizes, each size adapted to a fixed interval of wrist sizes. The MIO Alpha Bluetooth Heart Rate Monitor uses a wristlet/bracelet similar to a watchstrap/-band with fixed pins to be fitted into holes perforated in the strap at different positions along the length of the strap. The user of prior art wearable electronic devices can choose between different and fixedly determined sizes of such wrist wearable devices making them un-practical, heavy, and/or complicated with loose insert links to keep track of, wherefore their sizes delivered by a seller is limited.

SUMMARY OF THE INVENTION

With the above description in mind, then, an aspect of the present invention is to provide an electronic wearable device comprising an elongated member, wherein the electronic wearable device is adapted to be put on, worn on and removed from a part of a body of a user, e.g. a leg, e.g. an ankle, or arm, e.g. on a finger, a wrist, and/or an upper arm, which seek to mitigate, alleviate, or eliminate one or more of the above-identified deficiencies in the art and disadvantages singly or in any combination.

These and further objects are achieved by an electronic wearable device being adapted to be worn by a user and a wireless communication system comprising at least one such inventive electronic wearable device and at least one other mobile electronic communication device, and a method for controlling the fitting of the electronic wearable device.

According to the invention, there is provided an electronic wearable device being adapted to form a loop around a body part of a user, and comprising an elongated member being a part of the loop and a control unit, wherein the elongated member comprises an electroactive polymer, whereby the shape of the electroactive polymer is adapted to be changed by regulating a voltage applied to the electroactive polymer, wherein the control unit is configured to regulate the voltage applied to the electroactive polymer for adjustment of the shape of the electroactive polymer, whereby the circumference of the loop is changed in response to the change in shape of the electroactive polymer. Hence, the inventive electronic wearable device can be made lighter and smaller while achieving more versatile and efficient size fitting than prior art. The size fitting of the electronic wearable device enabled by deformation of its shape changeable electroactive polymer, is adapted to be varied to a great extent, enabling the electronic wearable device to be adjusted in size for the user quickly and in a simple variable way such that the user is able to easily remove, put on and adjust the wearable device in size and between different sizes easy and quickly without the need of manual handling of any additional hardware, such as loose strap links or manually repositioning pins in perforations along the strap length for changing the strap length.

In an aspect of the invention, an electronic wearable device is provided, wherein the length of the elongated member is adapted to be changed in response to the change in shape of the electroactive polymer. In another aspect of the invention, an electronic wearable device is provided, wherein the control unit is configured to regulate the voltage applied to the electro-active polymer for adjustment of the length of the elongated member. In yet another aspect of the invention, an electronic wearable device is provided, wherein the shape of the electro-active polymer is configured to deform in substantially the circumferential direction of the loop by regulating voltage applied to the electroactive polymer. In still another aspect of the invention, an electronic wearable device is provided, wherein the shape of the electroactive polymer is configured to deform, whereby its length is increased or decreased in substantially the same direction as the direction of extension of the elongated member by regulating voltage applied to the electroactive polymer. In a further aspect of the invention, an electronic wearable device is provided, wherein the electroactive polymer is a deformable length segment and/or layer of the elongated member. In an additional aspect of the invention, an electronic wearable device is provided, wherein the whole length of the elongated member is made of the electroactive polymer. An electronic wearable device is provided according to an aspect of the invention, wherein the elongated member is configured as a closed loop. In yet an additional aspect of the invention, an electronic wearable device is provided, wherein the elongated member comprises two or more electroactive polymer length segments and/or layers. In still an additional aspect of the invention, an electronic wearable device is provided, wherein the elongated member is covered by a flexible material. In yet a further aspect of the invention, an electronic wearable device is provided, wherein the electroactive polymer is covered by a flexible material. In still a further aspect of the invention, an electronic wearable device is provided, wherein the electroactive polymer is configured to expand or retract substantially lengthwise by regulating a voltage applied to the electroactive polymer. In one more aspect of the invention, an electronic wearable device is provided, wherein at least one strain gauge is operatively connected to the control unit of the electronic wearable device and to the elongated member. In one other aspect of the invention, an electronic wearable device is provided, wherein at least one strain gauge is arranged at the elongated member of the electronic wearable device. In yet another aspect of the invention, an electronic wearable device is provided, wherein at least one strain gauge is arranged at a primary part of the electronic wearable device. In still another aspect of the invention, an electronic wearable device is provided, wherein at least one strain gauge is arranged at one end of the elongated member. Additionally, in one aspect of the invention, an electronic wearable device is provided, wherein at least one strain gauge is arranged at one end of the elongated member and at one portion of the electronic wearable device. Moreover, in one additional aspect of the invention, an electronic wearable device is provided, wherein at least one strain gauge is arranged at a first end of the elongated member and at a second end of the elongated member. Furthermore, in one further aspect of the invention, an electronic wearable device is provided, wherein at least one strain gauge is arranged intermediary the elongated member and the electronic wearable device. In yet another aspect of the invention, an electronic wearable device is provided comprising controls operatively connected to the control unit for user activation, wherein the controls are adapted to be activated by the user when the electroactive polymer is to be deformed for adjusting the length of the elongated member.

According to the invention, there is provided an electronic wireless communication system comprising an electronic wearable device according to any preceding aspect and a mobile electronic communication device, the electronic wearable device and the mobile electronic communication device being adapted for wireless communication, wherein the mobile electronic communication device comprises a controller configured to wirelessly communicate with a control unit of the electronic wearable device for wirelessly adjusting the fitting of the electronic wearable device.

According to another aspect of the invention an electronic wearable device is provided, wherein the electronic wearable device further comprises a wireless Bluetooth transceiver adapted to communicate wirelessly using Bluetooth, Bluetooth low energy or therewith compatible protocols.

According to yet another aspect of the invention an electronic wearable device is provided, wherein the wireless transceiver is adapted to receive wireless signals comprising size fitting settings from an electronic communication device. By providing the electronic wearable device with wireless signals indicating that a mobile electronic communication device, connected wirelessly to the electronic wearable device, has received commands from a user and transferred them wirelessly to the electronic wearable device. Thereby, the electronic wearable device adjust the fitting of itself on a body part of the user in response to the wirelessly received fitting settings without the need of any additional hardware or manual handling of such hardware, such as manually detaching or attaching loose strap links or manual repositioning of pins in perforations along the strap length.

According to yet another aspect of the invention an electronic wearable device is provided, wherein the control unit is adapted to control the voltage that is provided to the at least one deformable electroactive polymer in response to output from an internal software application running and/or being activated on the electronic wearable device itself. By allowing the control unit to control the voltage to the at least one deformable electroactive polymer based on commands being output from an internal software application running and/or being activated on the electronic wearable device, the command signals to change the fitting of the electronic wearable device is delivered to the user without external signals being received wirelessly by the electronic wearable device. For instance, an internal application is configured to indicate that the electronic wearable device is to be tightened, loosened and/or removed and/or put on a body part, prompting an output to the control unit to apply a voltage to the at least one deformable electroactive polymer to suit the user.

According to yet another aspect of the invention an electronic wearable device is provided, wherein the at least one deformable electroactive polymer is deformable such that it expands or retracts in substantially the same direction of extension of the elongated member of the electronic wearable device when the voltage is applied. By providing the electronic wearable device with an electroactive polymer that is deformable and changes its shape, e.g. in the lateral and/or longitudinal direction of the elongated member, in response to the regulation of voltage, the user is provided with a large variation of size fittings for the electronic wearable device eliminating the need of loose and additional strap links to be manually removed or added to the strap for changing its length or manually moving pins from one set of perforations to another set of perforations at another position along the strap length to manually change the strap length.

According to yet another aspect of the invention an electronic wearable device is provided, wherein the at least one electroactive polymer has a thickness in the range of 0.5 to 10 mm, preferably in the range 1 to 5 mm. By providing a electroactive polymer with a thickness in the range of 0.5 to 10 mm, preferably in the range of 1 to 5 mm, a sufficient amount of material and shape change is achievable when the voltage is applied to deform the at least one electro-active polymer. This ensures that a user of the electronic wearable device may distinctly feel and securely control the changes of the fitting/size of the electronic wearable device.

According to yet another aspect of the invention an electronic wearable device is provided, wherein the at least one deformable electroactive polymer has a size in the range of 0.5 to 100 mm, preferably in the range of 1 to 90 mm. By providing at least one electroactive polymer with a size, as measured across the segment from one side to the other, in the range of at least 0.5 to 100 mm, preferably in the range of 1 to 90 mm, the size and quantity of deformable electroactive polymer can be optimized while maintaining a high number of different sizes that the electronic wearable device could be changed into by using at least one deformable electroactive polymer.

According to yet another aspect of the invention an electronic wearable device is provided, wherein the elongated member comprises one, two or more electroactive polymer length segments. Each length segment and its associated deformation is optionally individually controllable by the control unit. By the electronic wearable device comprising one, two or more deformable segments, the amount/number of different sizes and variations of differing and adjustable sizes is at least doubled. By the electronic wearable device comprising one, two or more deformable segments individually controllable by the control unit, the amount and/or number of different sizes and variations of the size fitting is more than doubled. The electronic wearable device comprises one, two or more deformable segments which increase the size variations and broaden them and make the variation of sizes and size intervals more flexible and adaptable to many different sizes of body parts and configurations and structures of wearable devices without having to add hardware components or make the wearable devices more complex and simplify the wearable devices so that they do not have to be made up of separate and/or loose different parts that are necessary to handle manually.

The shape changes of the electroactive polymer, i.e. deformations of the at least one electroactive polymer segment, may be varied to a great extent depending on the registered strain in strain gauges and wishes of the user, enabling the inventive electronic wearable device to be easily changed in size and fitted to many differently sized body parts or even the same body part when the body part changes in size due to "swelling"/dilatation at hard work or training or in hot environments or due to constriction in cold environments or when the user is cold.

According to a further aspect of the invention a method for providing size changes of electronic wearable devices is provided, wherein the deformation of the at least one deformable electroactive polymer segment is controlled by the control unit regulating and/or controlling, for each deformable electroactive polymer segment individually, the voltage and/or polarity of voltage and/or duration of application of voltage and/or rate of voltage pulsation based on the obtained signals from buttons and/or wirelessly from a host device. By controlling the voltage and/or polarity of voltage and/or duration of application of voltage and/or rate of voltage pulsation based on the obtained signals, the deformation of the at least one deformable electroactive polymer segment, is variable in a large number of ways and/or magnitudes and order of magnitudes providing distinctly and/or step less variable sizes which size changes the user easily can control.

According to still another aspect of the invention, an electronic wearable device is provided, the electronic wearable device comprising an elongated member comprising one, two or more electroactive polymer segments. Each electroactive polymer segment comprises one, two or more layers of electroactive polymer material. Each segment and layer and associated deformation is optionally individually controllable by the control unit. By the electronic wearable device comprising one, two or more deformable electroactive polymer segments, the amount/number of sizes and variations of differing and adjustable sizes of the electronic wearable device is increased. By the electronic wearable device comprising one, two or more deformable segments and one, two or more deformable layers of electroactive polymer individually controllable by the control unit, the amount/number of different sizes and variations of the size fitting is at least or more than doubled. The electronic wearable device comprises one, two or more deformable segments and one, two or more deformable layers of electroactive polymer material, which further increase the number and amount of size variations and broaden them and make the variation of different sizes and size intervals more flexible and adaptable to many different sizes of body parts and configurations and structures of wearable devices without having to add and/or manually handle hardware components. The amount and/or volume and/or quantity of electroactive material used in the wearable devices is/are also optimized/minimized.

BRIEF DESCRIPTION OF THE DRAWINGS

The present technique will be more readily understood through the study of the following detailed description of the aspects together with the accompanying drawings, of which.

It should be added that the following description of the aspects is for illustration purposes only and should not be interpreted as limiting the disclosure exclusively to these aspects. For example, a user may wear and/or hold at least one, two, three or more different wearable electronic devices and/or mobile/portable electronic communication devices during use, such as holding a mobile phone and wearing headphones and a wristlet or bracelet or ring as in FIG. 1 in combination with a media plate and/or arm/ankle bracelet as in FIG. 2 while at the same time holding and/or wearing goggles/visors (not shown) during use.

DETAILED DESCRIPTION

Embodiments of the present invention will be described more fully hereinafter with reference to the accompanying drawings, in which embodiments of the invention are shown. This invention is adapted to be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

Aspects of the present invention will be exemplified using a portable electronic wearable device such as a watch or bracelet. However, it should be appreciated that the invention is as such equally applicable to other electronic wearable devices. Examples of such devices may for instance be any type of wristlet/ankle band/armband/ring, components integrated into clothes, necklaces, etc.

FIGS. 1 to 9 illustrate an overview of exemplary set ups according to the present invention. The set ups includes an electronic wearable device 1, 1' according to aspects of the invention, which electronic wearable device is adapted to be worn by a user. For instance, it may be worn as a watch, as illustrated in the exemplary set ups, however it is to be understood that it may be embodied in the shape of a wristlet/ankle band/armband/bracelet/ring, or incorporated into clothing, necklaces or similar items.

Figure 2:
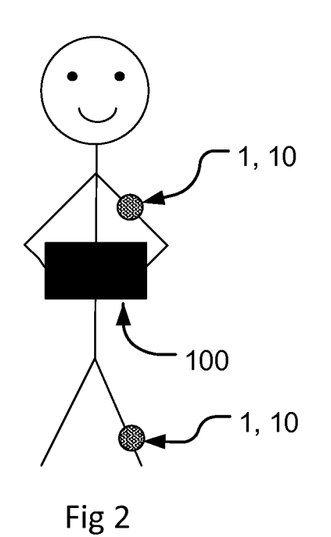
FIG. 2 illustrates another user wearing at least two electronic wearable devices and at least one mobile/portable electronic communication device in another scenario of how the present invention can be implemented.
Figure 3:
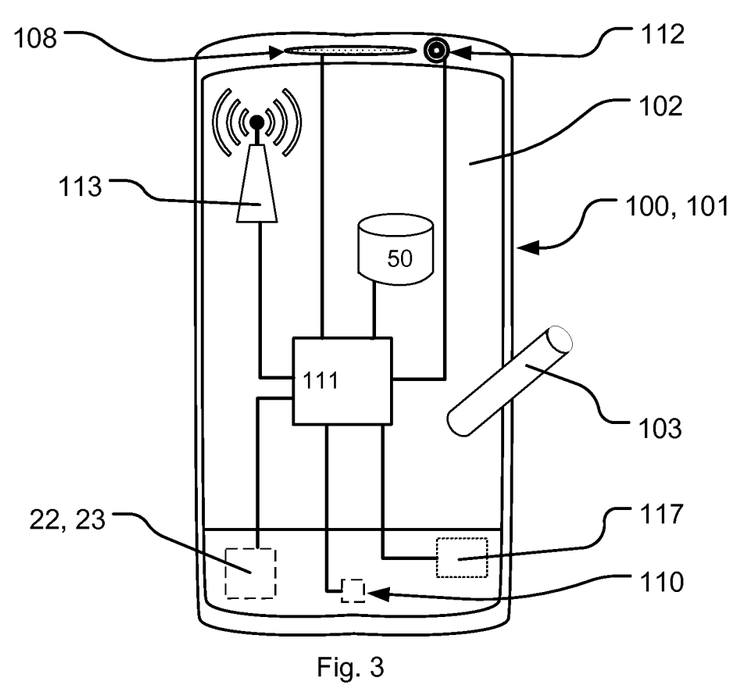
FIG. 3 illustrates an aspect of a mobile electronic communication device for wireless communication with the wearable electronic device of FIGS. 1 and 2 according to the invention.

In FIG. 3, a mobile electronic communication device 100 is illustrated as a mobile/smart phone, however, it should be appreciated that it is as such equally applicable to other electronic devices. Examples of such devices may for instance be any portable electronic device such as, e.g. a mobile radio terminal, a pager, a communicator, headphones/-set, an electronic organizer, a computer, a digital audio player such as a MP3-player or an iPod®, a tablet or media plate (e.g. iPad®) (see FIG. 2), a digital camera, any type of laptop (such as standard, ultra-portables, netbooks, and micro laptops) handheld computers, a portable digital assistant (PDA), tablet computers, gaming devices, accessories to mobile phones, etc. One, two or a plurality of mobile electronic communication devices 100 may be transmitting signals to the electronic wearable device 1 simultaneously, enabling the wearable device 1 to be controlled by one, tow or several mobile electronic communication devices 100 at essentially the same time or subsequently (see FIG. 15 with one such mobile electronic communication device 100).

In FIG. 3, the portable electronic communication device 100, according to aspects of the invention, comprises a casing 101, a display area 102 and means for navigating among items (not shown) displayed in the display area. The display area 102 may comprise a status indication area and one or more soft key bars, but is preferably a touch sensitive display 102. The status indication area may for example include symbols for indicating battery status, reception quality, speaker on/off, present mode, time and date, etc. The status indication section is not in any way limited to include the symbols and the functions presented herein. The device 100 is operable using the navigation means, e.g. by using a touch sensitive screen, e.g. a capacitive display, as disclosed in FIG. 3, by tapping a soft key icon directly with a pen-like object 103, a finger, or other body part. The functions of the soft keys are not limited by the functions indicated in the figure. Neither are the placements of the soft key bar and the status indication area limited to be placed at the bottom and the top of the screen. The navigation means is implemented using a touch sensitive display 102 as shown in FIG. 3, wherein the displayed items directly can be tapped by a user for selection, or be voice activated via a head-set or a built-in microphone 110. The mobile communication device 100 can also comprise other elements normally present in such a device, such as a keypad, a speaker 108, a camera 112, a processor/controller 111, a memory 50, one or more accelerometers (not shown), a vibration device (not shown), an AM/FM radio transmitter and receiver (not shown), a digital audio broadcast transmitter and receiver (not shown), a card reader 117 for smart cards, e.g. SIM and/or memory cards, etc. Each of the portable and wearable electronic devices 1 and 100 also comprises power supplies, such as at least one battery (not shown) for its operation.

Figure 14:
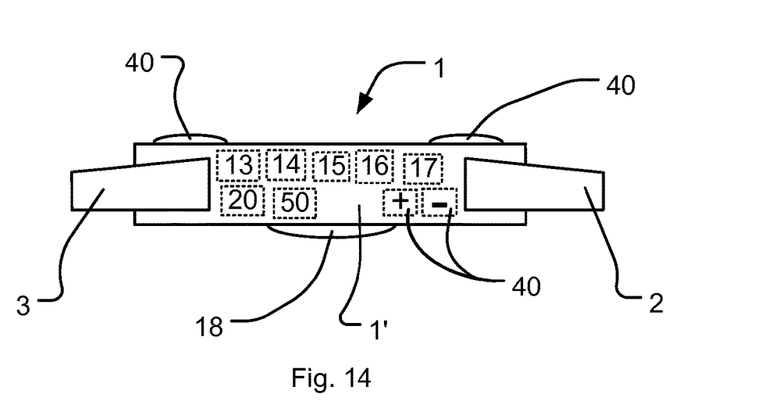
FIG. 14 illustrates still a further aspect of a wearable electronic device embodying an eleventh implementation of the invention.
Figure 15:
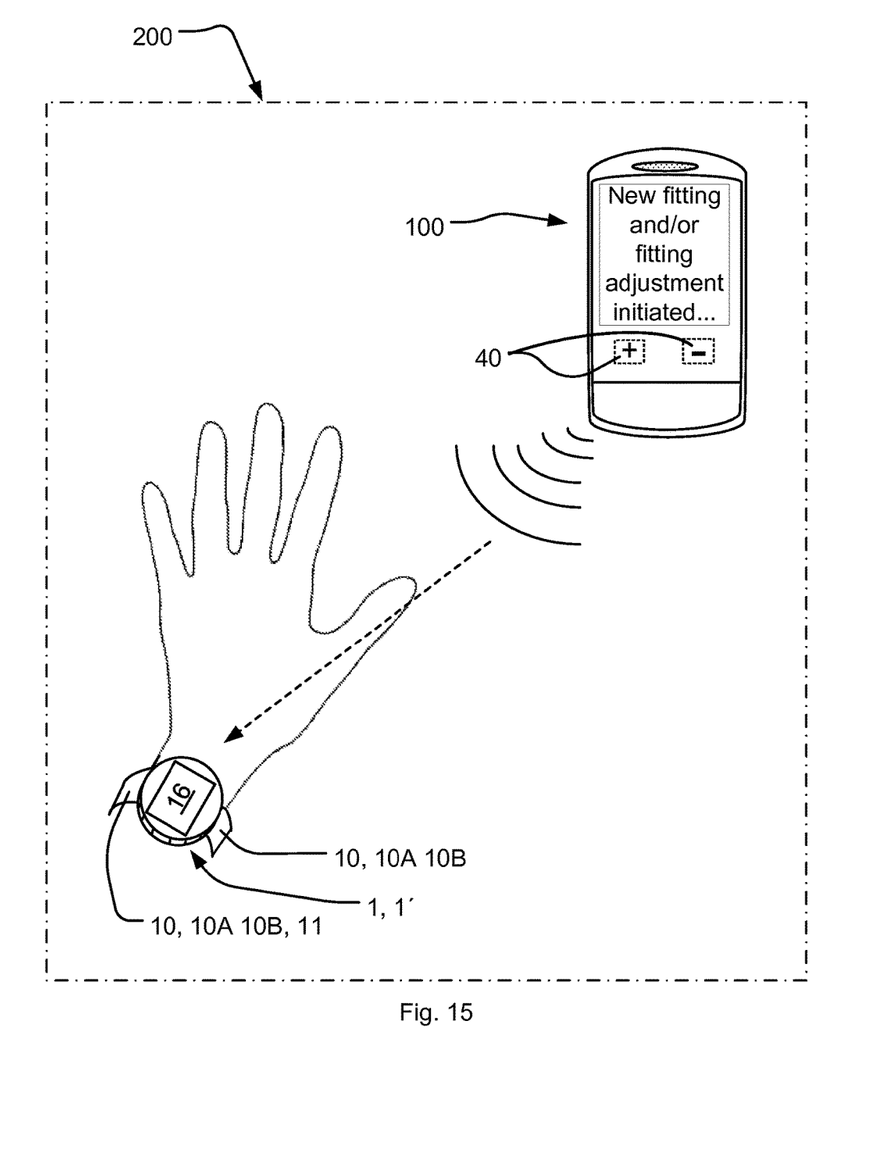
FIG. 15 illustrates an aspect of a system for wireless communication between a mobile electronic communication device and the wearable electronic device of FIGS. 1 to 14 according to the invention.
Figure 16:
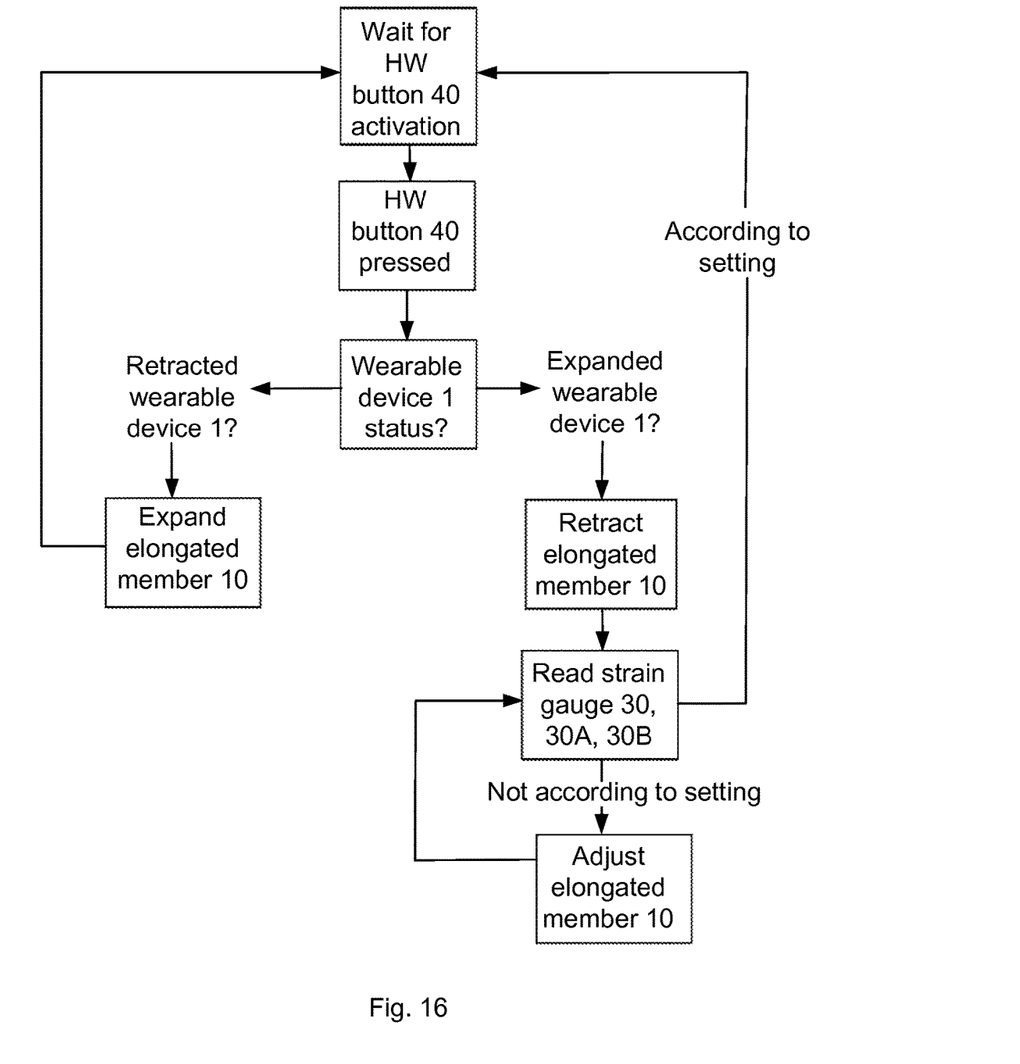
FIG. 16 illustrates a flowchart of a method for controlling different states of the wearable electronic device according to the invention when removing or putting it on a body part of a user.
Figure 17:
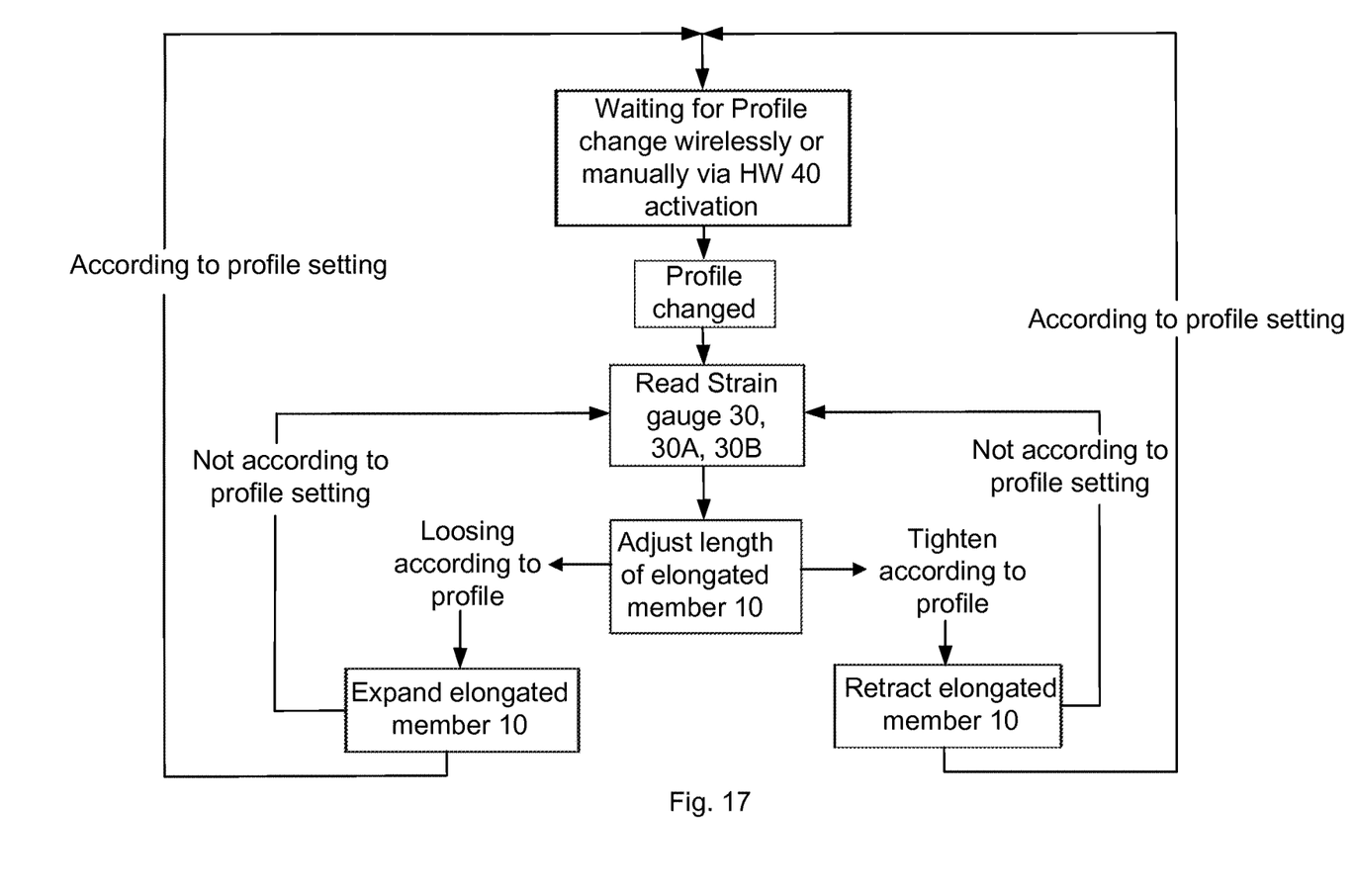
FIG. 17 illustrates another flowchart of a method for controlling different states of the wearable electronic device according to the invention for adjusting how tight the wearable electronic device is fitted when on a body part of a user.

FIGS. 1 to 14 illustrate examples of wearable electronic devices 1 and mobile electronic communication devices 100 according to the invention and FIG. 15 shows a system 200 according to the invention for wireless communication between at least one inventive electronic wearable device 1 and at least one mobile electronic communication device 100 according to the invention. FIGS. 16 and 17 illustrate flowcharts of aspects of methods for using and controlling the wearable electronic device 1 according to the invention, in particular for control of the inventive auto-fitting of the wearable electronic device 1.

These devices are adapted for operating in systems 200 for data transfer in a local or remote area network. The electronic wearable device 1 and the mobile electronic communication device 100 comprises corresponding and/or similar hardware, software and processing circuitry for their own autonomous operation and cooperation, e.g. by wireless communication therebetween, such as a central handling and processing unit, i.e. a control unit 20 in device 1 and the controller 111 in device 100 that may be constituted by any suitable Central Processing Unit (CPU), microcontroller, Digital Signal Processor (DSP), etc., capable of executing computer program code for evaluating and comparing signals for operation of the electronic devices 1 and 100. The electronic devices 1 and 100 each further comprises a memory 50 that can be used for storing computer program code, old/predefined values, e.g. capacitance values used to check if the wearable device 1 is on or in close proximity to a body or not, and threshold values, e.g. threshold capacitance values etc. The memory 50 can be any combination of a Read and write Memory (RAM), and a Read Only Memory (ROM). The memory 50 may also comprise persistent storage, which, for example, can be any single one or combination of magnetic memory, optical memory, or solid state memory or even remotely mounted memory. The electronic devices 1 and 100 also comprise additional components required for its operation, but these components are not explained further as this is common knowledge for a skilled person. The memory 50 itself is stored and arranged integrated and/or detachably arranged in or on the electronic wearable device 1, 100 itself. The devices 1 and 100 comprise antennas 13 and 113, respectively, for wireless communication. The wearable device 1 and the mobile communication device 100 comprises communication means, e.g. a wireless transceivers 14, 15 and 22, 23, respectively, e.g. suitable for long- and/or short-range wireless communication through the air, e.g. by using RF suitable for air transmission, e.g. Bluetooth™ (BT) forming wireless interfaces. The wireless transceivers 14 and 22 are adapted to receive and transmit wireless signals and wherein the control units 20, 111 are adapted to control the voltage based on desires of the user regarding fitting of the wearable device 1 obtained over the wireless interfaces, e.g. by the control unit 20 controlling the voltage in response to said received wirelessly sent new profiles/settings of wearable fitting from the mobile communication device 100. The electronic wearable device 1 may essentially be configured to function as an extension of the other communication device 100 transmitting new fitting settings to the electronic wearable device 1 in response to desires of the user either putting on, removing or wishing to adjust the fitting of the wearable device 1 on his/her body. The wireless transceivers 15 and 23 may further be wireless Bluetooth transceivers adapted to communicate wirelessly using Bluetooth, Bluetooth low energy or therewith compatible protocols. This enable the electronic wearable device 1 and/or the mobile electronic communication device 100 that each comprises a Bluetooth transceiver to be connected to each other and thereby transmit signals that can be predetermined or spontaneously initiated by the user of the electronic wearable device 1.

Figure 1:
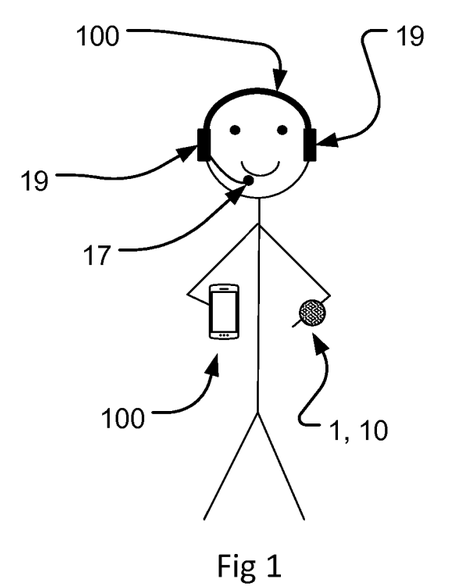
FIG. 1 illustrates a user wearing at least one electronic wearable device and at least two mobile/portable electronic communication devices in one scenario of how the present invention can be implemented.
Figure 4:
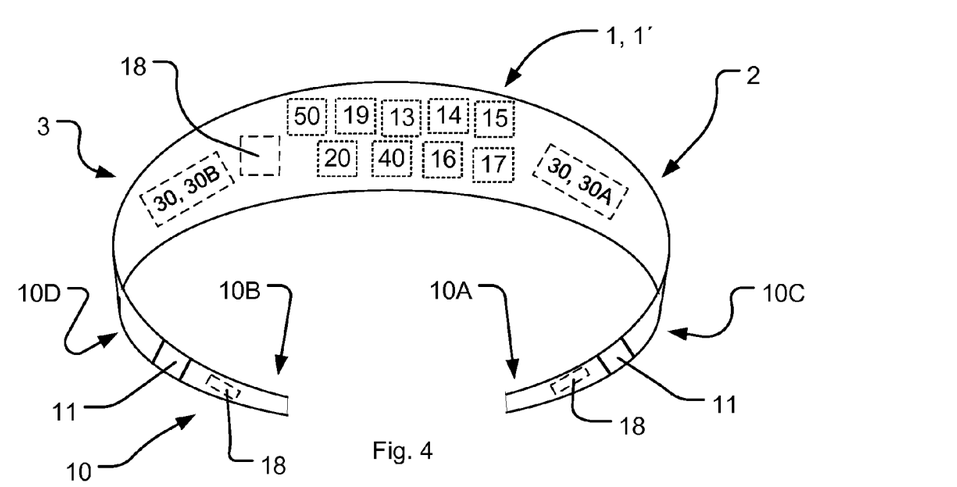
FIG. 4 illustrates an aspect of a wearable electronic device embodying a first implementation of the invention.
Figure 5:
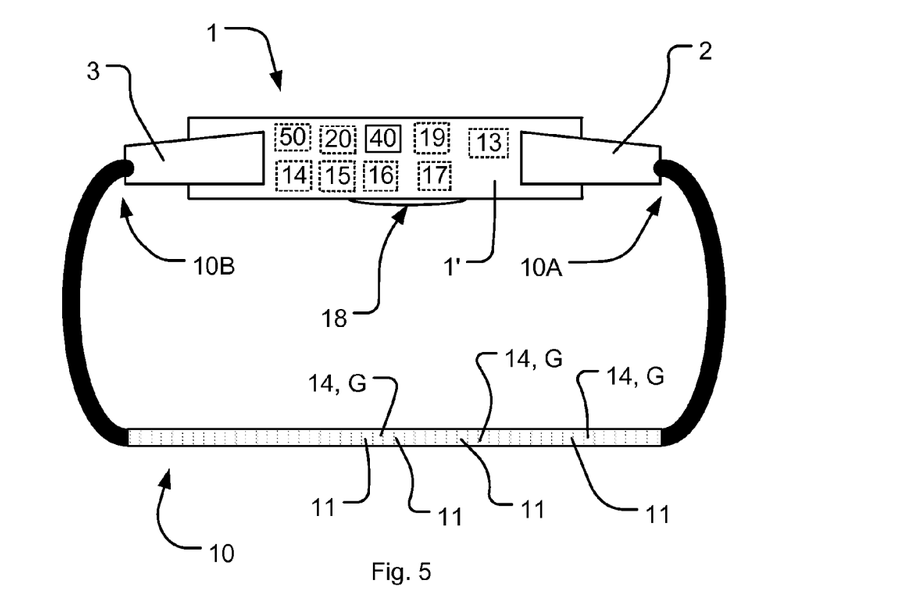
FIG. 5 illustrates another aspect of a wearable electronic device embodying a second implementation of the invention.

The wearable device 1 and/or the mobile communication device 100 comprises at least one microphone 17 similar to the headset 100 in FIG. 1 and a smartphone 100 in FIG. 3; and, optionally, at least one display 16. In one aspect, as shown in FIG. 4, the microphone is placed in the wearable device 1, as an internal microphone. In another example, the microphone is placed outside the wearable device (not shown), thus it is an external microphone. The wearable device 1 and the portable electronic communication device 100 are also adapted to comprise necessary components and circuitry for short range wireless communication referred to as Near Field Communication (NFC). The use of and required equipment and components 14, 15 in the wearable device 1 and 22, 23 in the mobile electronic communication devices 100 for enabling RF, BT and NFC communication are only schematically explained as this is common knowledge for the skilled person.

The electronic wearable device 1 is adapted to form a loop around a body part of a user, see FIGS. 4 to 11. Hence, the loop is easily threaded on or off the body part of the user to be put on or removed from the body part. The electronic wearable device 1 comprises an elongated member 10 (see FIGS. 4 to 11). FIG. 4 shows one aspect of the wearable device 1 according to the invention with the elongated member 10 divided/split to have one free end 10A and another free end 10B. The free ends 10A and 10B are adapted to be detachably connected and form a closed loop when connected. In one aspect of the wearable device 1 according to the invention, the free ends 10A and 10B is detachably connected to form a closed loop before threading the electronic device 1 on a body part for use. In another aspect of the wearable device 1 according to the invention, the free ends 10A and 10B is detachably connected to form a closed loop after the electronic device 1 is put on a body part for use, similar to a watchstrap. The elongated member 10 is a part of the loop (see FIGS. 4 to 10A). The electronic wearable device 1 comprises the control unit 20 (see FIGS. 4 to 9 and 12 to 14). The elongated member 10 comprises an electroactive polymer 11. The electroactive polymer is a so called electro active polymer 11 or EAP material 11 that is shape-changeable in response to voltage applied to the material or removed from the material. The shape of the electroactive polymer 11 is adapted to be changed by regulating a voltage applied to the electroactive polymer. The control unit 20 is configured to regulate the voltage applied to or removed from the electro-active polymer 11. The control unit 20 is configured to regulate the voltage applied to the electroactive polymer 11 for adjustment of the shape of the electroactive polymer 11. The control unit 20 is configured to regulate the voltage applied to the electroactive polymer 11 so that the circumference of the loop is changed in response to the change in shape of the electroactive polymer 11.

FIGS. 5 to 9 show other aspects of the wearable device 1 according to the invention where the elongated member 10 is not divided/split with free ends 10A, 10B. Here, the elongated member 10 of the wearable device 1 according to the invention is continuous and/or endless. In another aspect, the elongated member 10 of the wearable device 1 according to the invention is shown in FIGS. 5 to 9 with its free ends 10A and 10B connected together to form a loop configured to surround a body part of the user (FIG. 4 shows the free ends 10A and 10B in a non-connected state).

FIGS. 1 to 11 show schematic overviews of aspects of wearable electronic devices 1. In one aspect, the wearable device 1 is a wrist band, sometimes also referred to as a wristlet, but could also be a bracelet, chest band, earring, ring on a finger, ankle band or necklace, intended for a user to wear around the wrist of the arm or on a finger or ankle of the leg or the neck. In FIG. 14, the wearable electronic device 1 is shown without the elongated member 10 to clarify that the wearable device 1 in some aspects comprises a separate primary part 1' or master control unit 1' similar to a wristwatch without a strap, which separate primary part/master control unit 1' is adapted to be operatively connected to the strap, i.e. the elongated member 10 to control its electroactive polymer 11 according to the invention, while in some aspects, e.g. as the example in FIG. 4, the primary part 1' or master control unit 1' in FIG. 14 is not a separate part, instead, the elongated member 10 and its electroactive polymer 11 is in fact an integrated part of the primary part 1' or master or control unit 1' together forming one unitary wearable device 1. This means that the elongated member 10 and its electroactive polymer 11 is configured to be detachably attached but still operatively connected to the primary part 1' or master control unit 1' but is, optionally, configured to be non-detachably attached to the primary part 1' or master control unit 1' while maintaining operability and shape changeability therebetween.

In one aspect of the electronic wearable device 1 according to the invention, the size and/or circumference of the loop of the electronic wearable device 1 according to the invention is variable in response to the deformation/change in shape of the electroactive polymer 11. In one aspect, the length of the elongated member 10 is adapted to be changed in response to the deformation/change in shape of the electroactive polymer 11. The shape of the electro-active polymer 11, e.g. its length (L) and/or width (W) and/or thickness (T) (see the dimensions shown as L, W and T in FIGS. 10, 10A and 11), is changeable. In another aspect of the electronic wearable device 1 according to the invention, the control unit 20 is configured to regulate the voltage applied to the electroactive polymer 11 for adjustment of the length of the elongated member 10. In another aspect of the electronic wearable device 1 according to the invention, the shape of the electroactive polymer 11 is configured to deform in substantially the circumferential direction of the loop by regulating voltage applied to the electroactive polymer (see examples of FIGS. 5, 6 and 7, and 10 and 11). In yet another aspect of the electronic wearable device 1 according to the invention, the shape of the electroactive polymer 11 is configured to deform, whereby its size, e.g. its length L, its width W and/or its thickness T, is increased or decreased by regulating voltage applied to the electroactive polymer (see examples of FIGS. 6 and 7, and 10 and 11). In a further aspect of the electronic wearable device 1 according to the invention, the shape of the electroactive polymer 11 is configured to deform lengthwise and/or "breadthwise" and/or radially in relation to the loop by regulating voltage applied to the electroactive polymer (see examples of FIGS.

6 and 7 and 10 and 11). In still another aspect of the electronic wearable device 1 according to the invention, the shape of the electroactive polymer 11 is configured to deform, whereby its size, e.g. its length L, its width W and/or its thickness T, is increased or decreased in substantially the same direction as the direction of extension lengthwise of the elongated member 10 by regulating voltage applied to the electroactive polymer (see examples of FIGS. 6 and 7 and 10 and 11). In the optional aspect of FIG. 10A, the shape of the electroactive polymer/-s 11 (placed side-by-side if more than one layer of electroactive polymer material 11 is used) to the left is configured to deform, whereby its/their size, i.e. its/their width W or thickness T, is increased or decreased in substantially the same direction as the direction of extension lengthwise of the elongated member 10. In the optional aspect of FIG. 10A, the shape of the electroactive polymer/-s 11 (placed on top of each other if more than one layer of electroactive polymer material 11 is used) to the right is configured to deform, whereby its/their size, i.e. its/their length L or width W, is increased or decreased in substantially the same direction as the direction of extension lengthwise of the elongated member 10.

Figure 8:
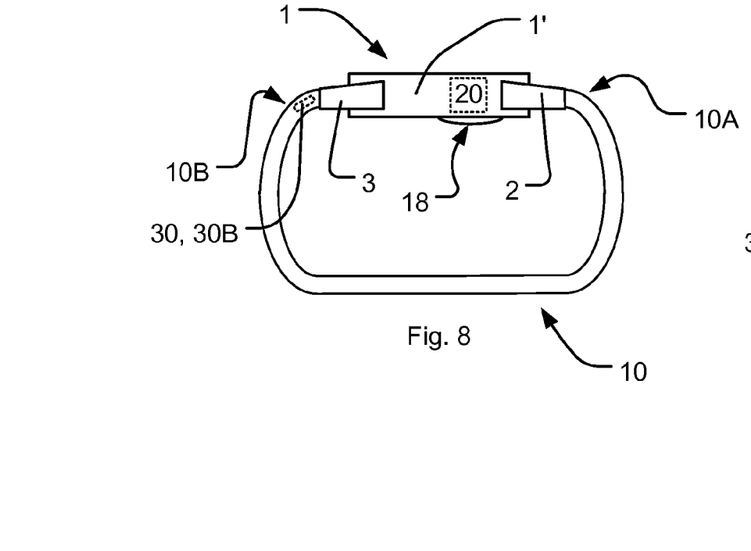
FIG. 8 illustrates yet another aspect of a wearable electronic device embodying a fifth implementation of the invention.
Figure 9:
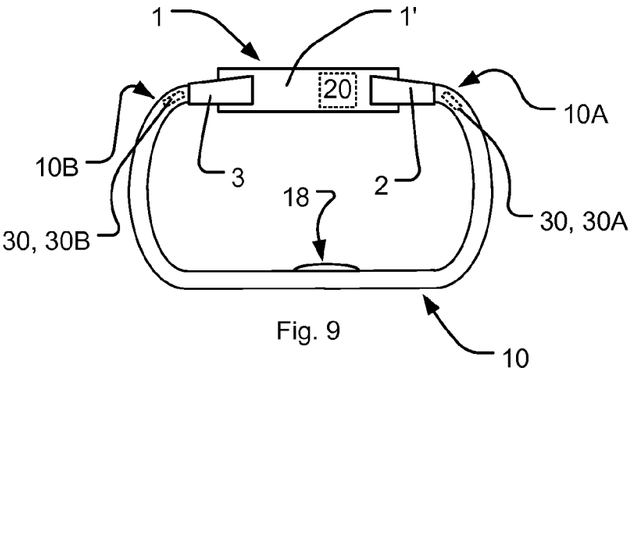
FIG. 9 illustrates a further aspect of a wearable electronic device embodying a sixth implementation of the invention.
Figure 10:
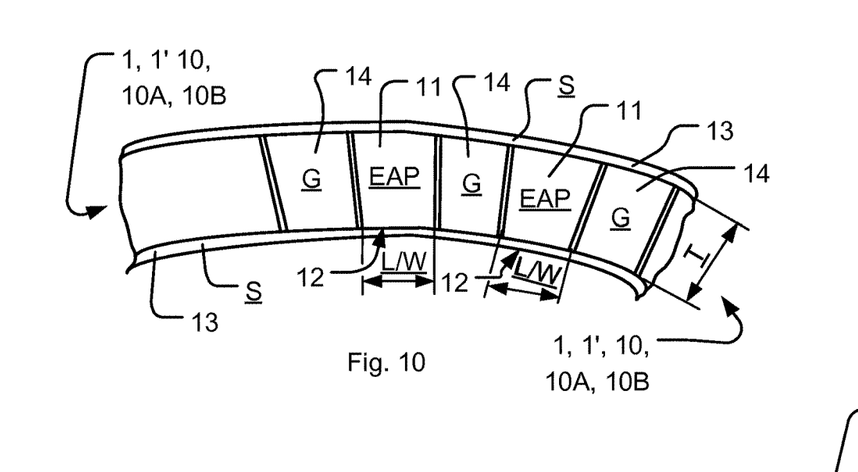
FIG. 10 illustrates a part of another aspect of a wearable electronic device embodying a seventh implementation of the invention in one state/mode.
Figure 11:
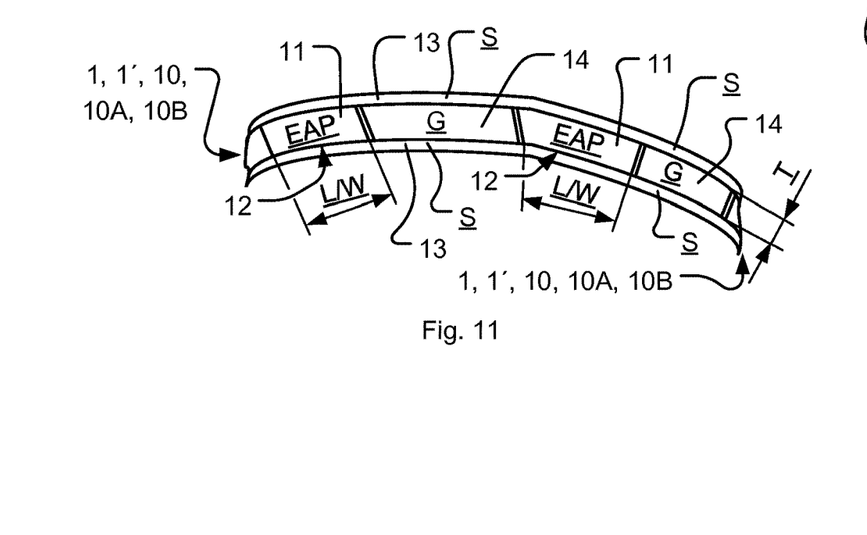
FIG. 11 illustrates the part of the wearable device in FIG. 10 in another state/mode.
Figure 12:
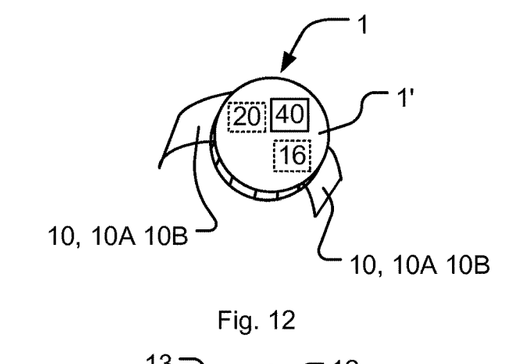
FIG. 12 illustrates a further aspect of a wearable electronic device embodying a ninth implementation of the invention.

As shown in FIGS. 4 to 7 and 10 and 11, the electronic wearable device 1 according to one aspect according to the invention comprises the electroactive polymer 11 in form of a deformable length segment 12 of the elongated member 10. As shown in FIGS. 8 and 9, in the electronic wearable device 1 according to another aspect of the invention, the whole length of the elongated member 10 is made of the electroactive polymer 11. As shown in FIGS. 8 and 9, the elongated member 10 of the electronic wearable device 1 according to yet another aspect of the invention is configured as a closed loop. As shown in FIGS. 5, 6, 7, 10 and 11, in the electronic wearable device 1 according to another aspect of the invention, the elongated member 10 comprises one, two or more electroactive polymer length segments and/or layers 12. As shown in FIGS. 10 and 11, in one further aspect of the electronic wearable device 1 according to the invention, the elongated member 10 is covered by a flexible material. In an aspect of the electronic wearable device 1 according to the invention, the flexible material is silicone 13 (S) but in other aspects, the flexible material is any other suitable resilient and flexible material. In another aspect of the electronic wearable device 1 according to the invention, the electroactive polymer 11 is covered by a flexible material. This is of advantage due to considerations of appearance, wear and optimization of the amount of material used for manufacturing the wearable device 1, e.g. by only covering every second deformable length segment 12 of the elongated member 10. In yet another aspect of the electronic wearable device 1 according to the invention, the electroactive polymer 11 is configured to expand or retract substantially lengthwise by regulating a voltage applied to the electroactive polymer. In still another aspect of the electronic wearable device 1 according to the invention, at least one strain gauge 30, 30A, 30B is operatively connected to the primary part 1' of the wearable device 1 and its control unit and the elongated member 10 (see FIGS. 4 and 9). In a further aspect of the electronic wearable device 1 according to the invention, at least one strain gauge 30A, 30B is arranged at the elongated member 10 of the electronic wearable device 1 (see FIGS. 4 and 6). In yet a further aspect of the electronic wearable device 1 according to the invention, at least one strain gauge 30A, 30B is arranged at the primary part 1' of the electronic wearable device 1 (see FIGS. 4 and 9). In still another aspect of the electronic wearable device 1 according to the invention, at least one strain gauge 30A, 30B is arranged at one end 10A, 10B of the elongated member 10 (see FIGS. 4 and 6). An electronic wearable device 1 in one other aspect according to the invention comprises at least one strain gauge 30A, 30B at one end 10A, 10B of the elongated member 10 and at one portion 2, 3 of the electronic wearable device 1 and/or the primary part 1' of the electronic wearable device 1 (see FIGS. 4 and 5). In one further aspect of the electronic wearable device 1 according to the invention, at least one strain gauge 30A, 30B is arranged at a first end 10A of the elongated member 10 and at a second end 10B of the elongated member 10 (see FIGS. 4 and 6). In yet one further aspect of the electronic wearable device 1 according to the invention, at least one strain gauge 30A, 30B is arranged intermediary the elongated member 10 and the primary part 1' of the electronic wearable device 1 (see FIGS. 4 and 9).

In another aspect of the electronic wearable device 1 according to the invention, the device 1 comprises controls 40 in the form of hardware buttons 40 (HW 40 in FIGS. 16 and 17) operatively connected to its control unit 20 for user activation. The hardware controls 40 are adapted to be activated by the user for adjusting the length of the elongated member 10 in response to the desire of the user by means of deforming the electroactive polymer 11 by regulating voltage applied to it. This control may be made automatically in response to registered strain in at least one strain gauge 30, 30A, 30B. The control and adjustment of the fitting of the wearable device 1 for removing it from or putting it on a body part of a user or for adjusting how tight the wearable device 1 is fitted around a body part of a user is possible to do in two ways. One way is using hard ware, such as the on/off or volume buttons for increasing and lowering volume (see buttons "+(plus/increase)" and "−(minus/decrease)" in FIG. 14 on the side of the main/primary part 1' of the wearable device 1) or separate buttons 40 on the upper surface of the primary part 1' facing away from the body part and shown from the side in FIG. 14. Hence, these buttons 40, and + and/or − are activated, e.g. pushing left button 40 tightens the wearable device 1 by decreasing its circumference while pushing the right button 40 loosens the wearable device by increasing its circumference or vice versa depending on the computer programming. The size of the wearable device 1 is increased and decreased by means of regulating the voltage to the electroactive polymer 11 of the elongated member 10 by means of the wearable device alone. The regulation of voltage is done so that the electroactive polymer 11 retracts for decreasing the length of the elongated member 10 and expands for increasing the length of the elongated member. The other way uses in principle and functionally the same effects of regulating voltage to the electroactive polymer 11 but initiates this function wirelessly instead of directly and manually on the wearable device 1 itself by means of the user interface of the mobile electronic communication device 100, such as a mobile phone 100, in FIG. 15, to adjust the fitting of the wearable device 1. This is done by wireless communication between the wearable device 1 and the mobile phone 100, where the mobile phone 100 works as the master and the wearable device 1, e.g. its primary part 1', as a slave performing the actions "ordered" by the master. Hence, this wireless control of size and fitting change of the wearable device 1 is firstly initiated by the user via for example displayed buttons on a touch sensitive display 102 on the smart phone 100, which buttons have similar or the same functions as the hardware buttons 40.

The electronic wearable device 1 is adapted to be provided with at least one speaker 19 and/or at least one camera (not shown on the wearable device 1) similar to the headset 100 of FIG. 1 or the microphone 110 and speaker 108 and camera 112 of the smartphone 100 of FIG. 3, even though the microphone and speakers are not shown in FIG. 2.

In FIG. 1, there is schematically shown an example of a first wearable electronic device 1, in addition to the other two electronic wearable devices 1 (shown as one armband on the upper arm of the user and ankle band on left ankle of the user in FIG. 2), in the form of a bracelet and/or wristband 1, which is shown in more detail and partially in FIGS. 4 to 11. The user could of course wear or hold more than one, two or three devices totally as long as at least one of them comprises the inventive elongated member 10 with the electroactive polymer 11. Preferably, a wearable device 1 comprises at least one inventive elongated member 10.

In one aspect of the electronic wearable device 1 according to the invention, the elongated member 10 is connected to a first portion 2 of the electronic wearable device 1, e.g. its primary part 1', (see FIGS. 5 to 11). In another aspect of the electronic wearable device 1 according to the invention, the elongated member 10 is connected to a second portion 3 of the electronic wearable device 1 e.g. its primary part 1', (see FIGS. 5 to 11). In yet another aspect of the electronic wearable device 1 according to the invention, the elongated member 10 is configured to extend from the first electronic wearable device portion 2 and back to the second electronic wearable device portion 3 as a continuous loop and/or band (see FIGS. 5 to 9). In still another aspect of the electronic wearable device 1 according to the invention, the elongated member 10 is configured to extend with a first portion 10C from the first electronic wearable device portion 2 into a free end 10A and to extend with a second portion 10D from the second electronic wearable device portion 3 into a second free end 10B as a discontinuous and/or divided/split loop and/or band (see FIG. 4). The portions of the elongated member 10 in FIG. 4 is flexible but rigid enough to let an user easily put on or remove the wearable device 1 from a body part. In FIG. 4, the transition from portions 2 and 3 of the wearable device 1 to the elongated member 10 is smooth and in principle invisible. The elongated member 10 and its portions 10C and 10D are configured to be integrated parts of the wearable device 1. In a further aspect of the electronic wearable device 1 according to the invention, the elongated member 10 is connected at a first end 10A to the first portion 2 of the electronic wearable device 1 and at a second end 10B to the second portion 3 of the electronic wearable device.

The invention concerns inventive wearable electronic devices 1 that are dynamically expandable and retractable enabling true one-size-fits-all wristbands by means of auto-fitting/-adjustability capability. The inventors have realized that in order to manufacture auto-fitting wearable electronic devices 1, e.g. wristbands, there is a need to use a material that is able of rapid and large expansion and retraction. The inventors have also solved the problem of "just enough" retraction to not cause damage to the users wearing such a device 1 around a body part. The materials capable of rapid and large extraction and retraction for usage according to the invention are electroactive polymer materials 11 (EAP materials). Those materials are capable of fast expansion (typically in range of milliseconds) and also of large expansion (up to 400% or more).

As shown in FIGS. 4 to 11, the material is comprised in one part of the wearable device 1, e.g. a wristband (see FIGS. 4 to 7), or simply made as the entire wristband 1 as in FIGS. 8 and 9. If EAP material 11 is placed in only a portion of the band 1, i.e. in only a portion of each elongated member 10, it is needed approximately 1-100 mm of the material. In another aspect, there is used 10-25 mm of the material that can therefore expand to be 40-100 mm in total. This means expansion of 30-75 mm, which should be enough to make the band 1 fit or be able to be thread over a fist. Those measurements can of course be adjusted, this is just examples, in one aspect, at least two small/thin/short pieces and/or layers of EAP material 11 are used. Another aspect is to use at least one large/wide/thick/long piece and/or layer of EAP material 11. In other aspects, combinations are possible, e.g. use of at least one smaller and/or thinner and/or shorter piece and/or layer of EAP material 11 and at least one larger and/or wider and/or thicker and/or longer piece and/or layer of EAP material 11. In another aspect, use of at least one piece and/or layer of EAP material 11 having a size of 0.5 to 10 mm is possible. In still another aspect, use of at least one second piece and/or layer of EAP material 11 having a size of 1 to 100 mm, preferably 10 to 50 mm, more preferable 15 to 40 mm, most preferable 20 to 30 mm, or 25 mm is applicable. Those measurements can of course be adjusted, this is just examples, other combinations are possible, e.g. using at least one piece and/or layer of EAP material 11 having a size of 0.5 to 10 mm and at least one second piece and/or layer of EAP material 11 having a size of 1 to 100 mm, preferably 25 mm. The size is either the length L or the width W or the thickness T or any combination of two or more of these measures or dimensions of the piece and/or layer of EAP material 11 depending on the particular inventive aspect/design of the wearable device 1.

In order to activate extraction of the wearable device 1, e.g. the wristband of FIGS. 4 to 11, or before the wearable device 1 is to be put on, the user will press the hardware button/-s 40 or a combination of buttons (typically volume and/or power button) or a displayed button on the GUI of the mobile electronic communication device 100 that then send signals wirelessly to the wearable 1 to initiate extraction. Once this is done, voltage is supplied to the wearable device 1, i.e. the elongated member 10 and its electroactive polymer 11, for example in the form of a band (in this case around 1V) and this will cause the material 11 to expand to maximum size. After the user has fitted the wearable device 1 on the wrist and/or the ankle and/or the arm and/or the finger, the button or combination of buttons 40 will be released alternatively pressed again and this will initiate retraction process. To retract the electroactive material 11, the voltage supplied is simply removed or there is put negative voltage over the electroactive material 11. If the power is cut or polarity reverses depends on if the electroactive polymer 11 is bi-stable or not. Bi-stable means that if voltage is applied to the electro-active material 11, the electroactive material 11 deforms and maintains its shape after it has deformed even though the voltage thereafter is removed. Hence, the elongated member 10 maintains its "new" fitting/length/size/circumference. If an EAP material 11 that is not bi-stabile is used, the specific voltage applied to deform it must be "present" all the time, i.e. during all the time the EAP material 11 and elongated member 10 is intended to be in its "new" state/form/shape/size/length/circumference/fitting, if the voltage is not maintained, the EAP material 11 will not keep its deformed shape. This means constantly and/or continuously and/or steady applying the specific voltage to the EAP material 11, i.e. the specific voltage changing the shape of the electroactive polymer 11 is kept applied thereto to maintain the new chosen deformation of the electroactive polymer 11. Hence, for each time the specific voltage is changed or removed, i.e. in principle diminished to zero, another new shape change/ deformation occurs for the electroactive polymer 11. This specific voltage is different for different sizes/shapes. The preferred application is a bi-stable one, but this choice, i.e. to use a bi-stable EAP material 11 or not, depends on if other properties is desired, such as high/large or fast shape change and/or extreme stretchability, hence, the choice may make it difficult to achieve both high/large or fast shape change and extreme stretchability in all applications. However, EAP materials 11 are under a constant development, hence, future EAP materials 11 may be able to have both a high/large or fast shape change/deformation and extreme stretchability/retractability/extendability and be applicable in this invention.

Figure 6:
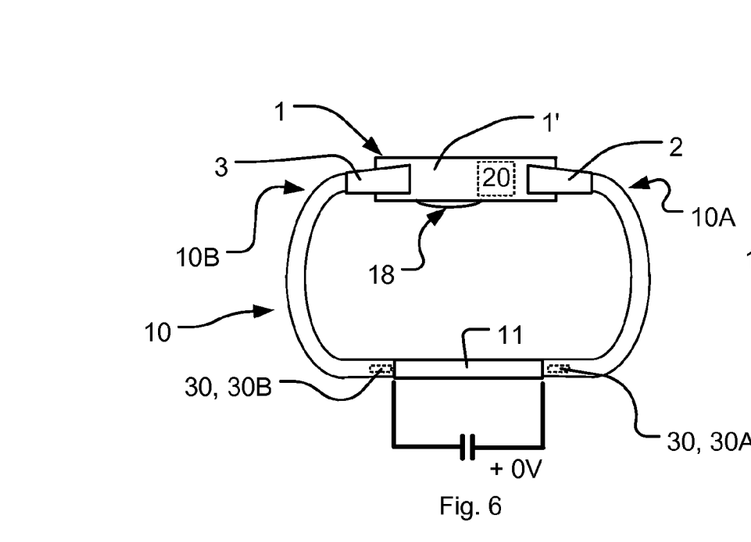
FIG. 6 illustrates yet another aspect of a wearable electronic device embodying a third implementation of the invention.
Figure 7:
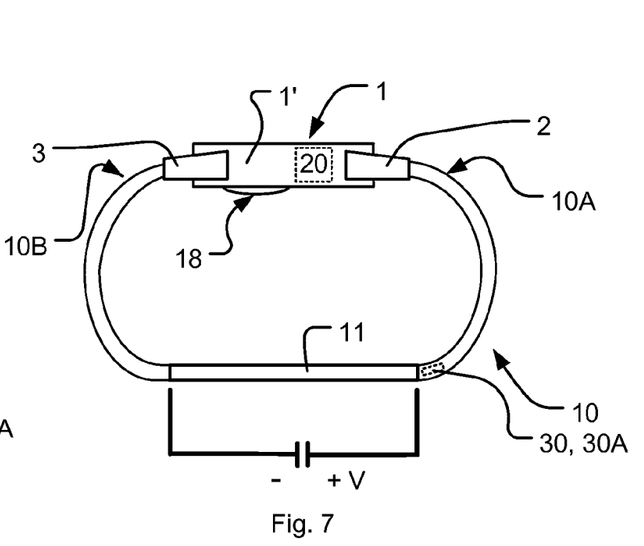
FIG. 7 illustrates still another aspect of a wearable electronic device embodying a fourth implementation of the invention.

To be able to perform retraction safely, there introduced one, two or several strain gauges 30, 30A, 30B in the wearable device 1. FIGS. 4, 6 and 9 show examples of placement of those strain gauges. The idea is that once retraction is started, at least one strain gauge 30, 30A, 30B will act as protection against too much retraction. Once detected that strain gauges are strained on or beyond certain limit, this will trigger a signal to stop retraction. In case of use of bi-stable EAP 11 the retraction is simply stopped and the material is let to stay at current shape, and if not bi-stable material 11 is used there is a need to ensure that the electroactive material 11 is steadily/continuously supplied with exact voltage that corresponds to the desired/current shape to maintain its shape/desired deformation into which it has been changed.

In one aspect of the invention, see for example FIG. 15, a user shall be able to adjust, in soft-ware, how hard the wearable device 1, e.g. a wristband, fits on/around the body part, e.g. the wrist or ankle. This setting will affect when and in what position the strain gauges 30, 30A, 30B shall give signal to stop retraction. In other words user will be able to adjust how hard the wearable device 1, e.g. a wristband is fitted around the wrist in a very fine grain way. Adjustment software can be placed within the wearable device 1, but should be adjustable from a host device 100, e.g. the smart phone 100. The entire work flow of the invention can be seen as methods of size control of the wearable device 1 in FIGS. 16 and 17.

Figure 13:
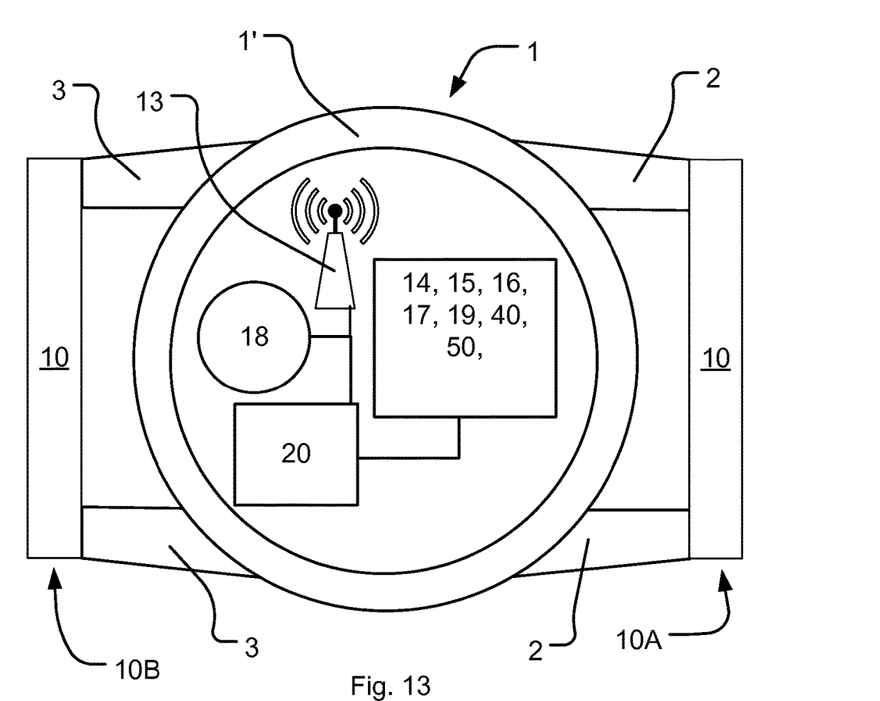
FIG. 13 illustrates yet a further aspect of a wearable electronic device embodying a tenth implementation of the invention.

Turning to FIG. 13, which illustrates a rear/underside view of an electronic wearable device 1 according to one aspect of the present invention, the electronic wearable device 1 comprises at least one capacitance sensor 18 applied to the elongated member/portion 10 of the mobile electronic wearable device 1 or on the underside of the wearable primary device/part 1, so that, when the electronic wearable device is worn by a user, the capacitance sensor 18 is arranged adjacent or even in contact with the body part of the user. The first electronic wearable device 1 comprises the memory/database 50 comprising at least predefined capacitance values being checked via the capacitance sensor 18 for checking if the wearable device 1 is on the body of a user or not. The first portable and wearable device 1 comprises a comparator (not shown) adapted for comparing the checked/measured capacitance via the capacitance sensor 18 with the predefined capacitance being stored in the database and/or the memory 50. This is to safeguard that any unnecessary adjustment of the fitting of the wearable device is not done when the wearable device 1 is not put on the body of the user. Hence, when any button with the size adjustment function is activated, independently if it is a hardware button 40 on the wearable device or a displayed button on the touch sensitive display 102 of the mobile electronic communication device 100, the control unit 20 and associated hardware and software (SW) firstly checks if the capacitance measured by the capacitance sensor 18 corresponds to a capacitance value meaning that the wearable device is put/present on a body part or a capacitance value meaning that the wearable device 1 is put/present on a body part or another capacitance value meaning that the wearable device is not put/present on a body part. This is shown in FIG. 16 where a method according to the invention for rough, coarse or large tuning of the size of the wearable device 1 is shown, i.e. for removing the wearable device from or putting it on a body part.

If the wearable device 1 is on a body part, the size/circumference of its loop/length of its elongated member 10 is decreased by regulating voltage to one or more of the electroactive polymers 11 and strain in one or more strain gauges 30, 30A, 30B is/are checked/read at the same time (this is done in a loop between box "Adjust elongated member 10" and box "Read strain gauge 30, 30A, 30B") until the fitting of the wearable device 1 and its elongated member 10 around the body part fulfil a general setting or a desired setting or wishes of the user. In FIG. 17, a method according to the invention for rough/coarse and/or fine tuning of the size and fitting of the wearable device 1 when on a body part is shown. Here, a change of profile for fitting is checked and if changed the strain value in one or more of the strain gauges 30, 30A, 30B is checked and the elongated member length adjusted so that it is tighter as shown to the right in FIG. 17 or loosened as shown to the left in FIG. 17.

The electroactive polymer 11 may be, in one aspect, an ionic electroactive polymer (EAP), which comprises five layers, top and bottom being encapsulation, two layers that are anode and cathode, which may be switchable, and in the middle the polymer. The electroactive polymer 11 may further comprise conjugated polymers used as actuator materials e.g. Polypyrrole (PPy), Polythiophene(PT), Polyethylenedioxythiophene (PEDOT) etc.

To apply electroactive polymers 11 (EAP) to wearable devices 1, e.g. wristbands, there is introduced compartments of EAP material in wristbands (see FIGS. 4 to 11). In FIGS. 10 and 11, there is shown silicone 13 (S) as a covering of the wearable device 1. One or more of the compartments are filled with Grilamid® 14 (G). In between each Grilamid® compartment there is EAP compartments filled with fitting EAP material 11. All of this is encapsulated in silicone so that the wearable device 1 is flexible (in FIGS. 10, 10A and 11 there is only shown a portion or section of one or more of the elongated members 10 as shown in FIGS. 4 to 9), except for its main part 1'. The main part 1' of the wearable device 1 is similar to the housing of a wrist-watch and is preferably sufficiently stiff to be able to house a display or the like. The elongated member 10 is similar to a sufficiently flexible watchstrap/-band of a wristwatch. EAP materials 11 can be made direction sensitive (e.g. the EAP material is tubes or rods made of Conductive Polymer). The reason for this is that if the wearable device 1 is filled with EAP 11 or the EAP 11 is placed in the wrong direction, the wearable device 1, e.g. a wristband 10, will only swell and not expand in the desired direction. In some aspects, the EAP material 11 decreases in thickness when expanding, wherefore the function of the Grilamid is to compensate for the diminishing thickness, i.e. to maintain its thickness. The strain gauges 30, 30A, 30B works as mentioned above to control the fitting of the wearable device 1, i.e. to regulate/adjust the size/length of its band or elongated member 10. In the aspect of FIG. 4, the main part 1' is integrated in the wearable device 1. The main part 1' and the wearable device 1 is one and the same entity in FIG. 4. The main part 1' and the wearable device 1 are one and the same in FIG. 4.

The invention proposes the idea of auto-fitting wearable devices 1, e.g. wristbands that can be used in wearable products. The inventive wearable device 1 is in one aspect waterproof. The idea and major difference to existing technology is that the invention enables to have wrist-bands that are in "one-piece" (or in some aspects divided in two or more elongated members 10 of which at least one elongated member comprises the conductive/electroactive polymer 11) but at the same time being capable of expanding and retracting and thus be fittable on any finger, wrist, leg, ankle or arm. The invention accomplishes a true "one size fits all" solution as the conductive/electroactive polymer 11 is deformable and able to change shape by regulating voltage applied to it. Another benefit is that a user will be able to adjust a wrist-/ankle-/arm-band size dynamically to fit the body part to for example cover different activities (tight fit for running, even tighter fit for heart beat monitor and loose fit for other occasions), see FIGS. 16 and 17.

Any ankle, arm, hand, wearable device 1 may be equipped with one or more displays 16 and/or one or more speakers 19, 108 or microphones 17, 110 (similar to the head phone microphone 17 in FIG. 1).

In one aspect of the invention, the elongated member 10 is adapted to form a loop around the body part when the electronic wearable device is worn on the user's body. The length of the elongated member 10 is adaptable to the size of the body part to enable the electronic wearable device 1 to be put on, worn on or removed from differently sized body parts. This size-adjustment/auto-fitting is achieved by means of a voltage being applied over or removed from the electroactive polymer 11. The regulation of voltage is performed by means of the control unit 20 configured to control the voltage applied over or removed from the electro-active polymer 11 for adjustment of the shape/length of the elongated member 10 in response to varying sizes of user body parts. In other aspects of the invention, the shape of the electroactive polymer 11 is configured to deform, whereby its length is increased or de-creased in substantially the same direction as the longitudinal direction of the elongated member 10 when a voltage is applied over or removed from the electroactive polymer. In one aspect, the whole length of the elongated member 10 is made of the electroactive polymer 11 In another aspect, the electroactive polymer 11 is configured to expand or retract lengthwise when a voltage is applied over or removed from the electroactive polymer 11. In still another aspect, at least one strain gauge 30, 30A, 30B is functionally/operatively connected to the control unit 20 of the electronic wearable device 1 and the elongated member 10 to safe guard that any strain of the elongated member when decreased in length do not exceed pre-determined strain values. In yet another aspect, at least one strain gauge 30A, 30B is arranged at one end 10A, 10B of the elongated member 10 and/or at one portion 2, 3 of the electronic wearable device 1. At least one strain gauge 30A, 30B is arranged at a first end 10A of the elongated member 10 and/or at a second end 10B of the elongated member 10 in one further aspect. Each strain gauge 30, 30A, 30B is in one aspect a separate link of the elongated member 10, the control unit 20 being operatively connected to this link. Controls, such as the hardware buttons 40 and/or the displayed button on the display 102 of the smart phone 100 in one aspect, are activated by the user when the electroactive polymer 11 is to be deformed for adjusting the fitting/size/length of the elongated member 10 by applying a voltage to or removing a voltage from the electroactive polymer in response to a predetermined strain in at least one of the strain gauges 30, 30A, 30B.

The mobile electronic communication device 100 comprises the controller 111 configured to wirelessly communicate with the control unit 20 of the electronic wearable device 1 in response to user activation for wireless control of the regulation of voltage applied to the electroactive polymer 11 for adjusting the length of the elongated member 10 of the electronic wearable device 1.

Figure 10A:
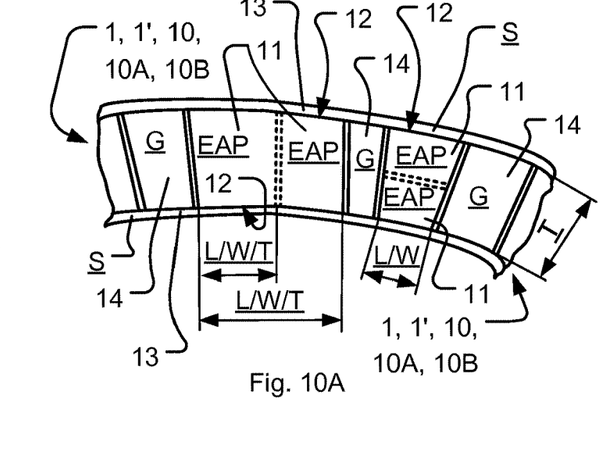
FIG. 10A illustrates a part of yet another aspect of a wearable electronic device embodying an eighth implementation of the invention.

In FIG. 10A, there is shown another aspect of the invention, wherein the electronic wearable device 1 is provided with the elongated member 10 comprising one, two or more electroactive polymer segments 12. In one aspect, each segment 12 comprises two or more layers of electroactive polymer material 11. In different aspects, each segment 12 is layered by at least two layers of electroactive polymer material 11 on top of each other (see the rightmost EAP piece of FIG. 10A where two layers are stacked on top of each other illustrated by the two dotted lines extending substantially in parallel with the elongated member 10), or side by side (see the leftmost EAP piece of FIG. 10A where two layers are stacked side by side illustrated by the two dotted lines extending substantially radially or perpendicularly to the elongated member 10). The elongated member 10 could in one aspect comprise at least one segment 12 being a single layer or a combination of two or more side by side layered electroactive polymer material 11. The elongated member 10 could in another aspect comprise at least one segment 12 being a single layer or a combination of at least two or more layers of on top of each other arranged electroactive polymer material 11. The elongated member 10 could in other aspects comprise at least one segment 12 being a single layer or a combination of two or more side by side layered electroactive polymer material 11 and at least one other segment 12 being a single layer or a combination of at least two or more layers of on top of each other arranged electroactive polymer material 11. In another aspect, the electroactive polymer segments 12 are placed side by side without any Grilamid compartment 14, G in between them (see leftmost EAP compartment 11 in FIG. 10A). In still another aspect, the electroactive polymer segments 12 are placed side by side with at least one Grilamid compartment 14, G in between two electroactive polymer segments 12 (see FIGS. 5, 10 and 11). In yet other aspects, other combinations of the above aspects are possible, such as two or more electroactive polymer segments 12 placed side by side and/or layers arranged on top of each other without any Grilamid compartment 14, G between them in combination with other electroactive polymer segments 12 and/or layers placed side by side and/or arranged on top of each other with at least one Grilamid compartment 14, G between them (see FIGS. 10, 10A and 11), The aspect of having at least one Grilamid compartment 14, G between segments 12 and/or layers arranged on top of each other is not shown but is easily understood if FIGS. 10, 10A and 11 is rotated 90° to the right or left as then the segments 12 and Grilamid compartments 14, G would be visualized as arranged or stacked on top of each other and the thickness T would be visualized as the length L and/or width W instead. These aspects of differently layered and arranged segments 12 and Grilamid compartments 14, G are combinable in any way.

The invention is able to be used for rough/coarse tuning/adjustment of fitting of the wearable device 1 or fine tuning/adjustment of fitting of the wearable device 1 but also for both rough and/or coarse and fine tuning/adjustment of fitting of the wearable device 1. This is in other aspects accomplished by using different predetermined fitting/sizes of elongated members or straps 10 comprising at least one electroactive polymer 11, e.g. small, medium, large or extra-large straps, such that the first rough/coarse tuning of fitting is chosen at purchase while any fine tuning of the strap fitting is done by regulating the voltage applied to the electroactive polymer 11 of the strap 10 during use of the wearable 1. This is in other aspects accomplished by not using differently fixed or predetermined fittings/sizes of elongated members or straps 10 comprising at least one electroactive polymer 11, instead only one size of straps 10 are sold, such that both the rough/coarse and fine tuning of the strap fitting/size is done by regulating the voltage applied to the electroactive polymer 11 of the strap 10. In still another aspect, this is accomplished by using different fixed/predetermined fitting/sizes of elongated members or straps 10 comprising at least one electroactive polymer 11, e.g. small, medium, large or extra-large straps 10 being choosable at purchase, which straps are interchangeable and detachably connected to the primary part 1' of the wearable 1, i.e. a bought medium-sized strap 10 may easily be replaced by a small- or large-sized strap, such that the first rough or coarse tuning of fitting is optionally chosen at purchase but this first choice of rough or coarse fitting of the strap may be changed by means of another differently sized strap, i.e. the first chosen predetermined fitting of a strap is correctable if not suitable for a user, while any fine tuning of the strap fitting is done by regulating the voltage applied to the electroactive polymer 11 of the strap 10.

The various aspects of the invention as described above and in conjunction with the appended drawings are meant to illustrate but not to limit the invention. The disclosed variations of the inventive aspects above are not restricted to the specifically shown examples, but are applicable on other variations of the invention and may also be combined in any way, e.g. the features of the example in FIG. 4 is combinable with all features or part of features or one or more of the features of the examples as shown in FIGS. 5 to 14 and vice versa.

The invention claimed is:

1. An electronic wearable device is adapted to form a loop around a body part of a user, the electronic wearable device comprising:
   a stiff primary part;
   an elongated member, connected to the primary part, being a part of the loop, wherein
   the elongated member comprises an electroactive polymer, whereby the shape of the electroactive polymer is adapted to be changed by regulating a voltage applied to the electroactive polymer;
   a control unit configured to regulate the voltage applied to the electroactive polymer for adjustment of the shape of the electroactive polymer, whereby the circumference of the loop is changed in response to the change in shape of the electroactive polymer, the voltage being steadily applied to the electroactive polymer to maintain the shape of the elongated member to correspond to a shape of the body part of the user; and
   at least one strain gauge operatively connected to the control unit, to control fitting of the electronic wearable device;
   wherein said at least one strain gauge is at least partly arranged at the primary part, and said at least one strain gauge is arranged intermediary the primary part and the elongated member.

2. An electronic wearable device according to claim 1, wherein the length of the elongated member is adapted to be changed in response to the change in shape of the electroactive polymer.

3. An electronic wearable device according to claim 2, wherein the control unit is configured to regulate the voltage applied to the electroactive polymer for adjustment of the length of the elongated member.

4. An electronic wearable device according to claim 2, wherein the electroactive polymer is a deformable length segment and/or layer of the elongated member.

5. An electronic wearable device according to claim 1, wherein the shape of the electroactive polymer is configured to deform in substantially the circumferential direction of the loop by regulating voltage applied to the electroactive polymer.

6. An electronic wearable device according to claim 1, wherein the shape of the electroactive polymer is configured to deform, whereby its length is increased or decreased in substantially the same direction as the direction of extension of the elongated member by regulating voltage applied to the electroactive polymer.

7. An electronic wearable device according to claim 1, wherein the whole length of the elongated member is made of the electroactive polymer.

8. An electronic wearable device according to claim 1, wherein the elongated member is configured as a closed loop.

9. An electronic wearable device according to claim 1, wherein the elongated member comprises two or more electroactive polymer length segments and/or layers.

10. An electronic wearable device according to claim 1, wherein the elongated member is covered by a flexible material.

11. An electronic wearable device according to claim 1, wherein the electroactive polymer is covered by a flexible material.

12. An electronic wearable device according to claim 1, wherein the electroactive polymer is configured to expand or retract substantially lengthwise by regulating a voltage applied to the electroactive polymer.

13. An electronic wearable device according to claim 1, wherein at least one strain gauge is arranged at the elongated member of the electronic wearable device.

14. An electronic wearable device according to claim 1, wherein at least one strain gauge is arranged at one end of the elongated member.

15. An electronic wearable device according to claim 1, wherein at least one strain gauge is arranged at one end of the elongated member and at one portion of the electronic wearable device.

16. An electronic wearable device according to claim 15, wherein at least one strain gauge is arranged at a first end of the elongated member and at a second end of the elongated member.

17. An electronic wearable device according to claim 1, wherein at least one strain gauge is arranged intermediary the elongated member and the electronic wearable device.

18. An electronic wireless communication system, comprising an electronic wearable device according to claim 1 and a mobile electronic communication device, the electronic wearable device and the mobile electronic communication device being adapted for wireless communication, wherein the mobile electronic communication device comprises a controller configured to wirelessly communicate with a control unit of the electronic wearable device for wirelessly adjusting the fitting of the electronic wearable device.

19. An electronic wearable device according to claim 1, wherein the circumference of the loop is changed by changing a thickness of the electroactive polymer.

20. An electronic wearable device according to claim 1, comprising
controls operatively connected to the control unit for user activation, wherein the controls are adapted to be activated by the user when the electroactive polymer is to be deformed for expanding the circumference of the loop to enable removal of the wearable device from and/or placement of the wearable device on the user.

* * * * *